United States Patent [19]
Conrad

[11] Patent Number: 5,105,195
[45] Date of Patent: Apr. 14, 1992

[54] SYSTEM AND METHOD FOR COMPENSATION OF IN-PHASE AND QUADRATURE PHASE AND GAIN IMBALANCE

[75] Inventor: John C. Conrad, Thousand Oaks, Calif.

[73] Assignee: Hughes Aircraft Company, Los Angeles, Calif.

[21] Appl. No.: 624,951

[22] Filed: Dec. 10, 1990

[51] Int. Cl.$^5$ .............................................. G01S 7/40
[52] U.S. Cl. ...................................... 342/174; 342/194
[58] Field of Search ................................ 342/174, 194

[56] References Cited
U.S. PATENT DOCUMENTS

| | | | |
|---|---|---|---|
| 3,950,750 | 4/1976 | Churchill et al. | 342/174 |
| 4,003,054 | 1/1977 | Goldstone | 342/174 |
| 4,122,448 | 10/1978 | Martin | 342/174 |
| 4,994,810 | 2/1991 | Sinsky | 342/174 X |

Primary Examiner—Gilberto Barrón, Jr.
Attorney, Agent, or Firm—C. D. Brown; R. M. Heald; W. K. Denson-Low

[57] ABSTRACT

A system and method for correcting a gain and phase imbalance between I and Q channels of a synchronous detector. The method of the invention includes the steps of: a) inputting a signal into the detector and extracting therefrom a received signal and a corresponding image signal; b) inputting the received signal in a first Doppler filter; c) inputting the image signal in a second Doppler filter; d) forming a first discriminant; e) forming a second discriminant; f) computing phase ($\phi$) and gain ($\rho$) errors from the first and second discriminants; g) calculating first and second correction factors based on the phase and gain errors; and h) using the correction factors to correct the phase and gain imbalance errors.

2 Claims, 2 Drawing Sheets

SYSTEM AND METHOD FOR COMPENSATION OF IN-PHASE AND QUADRATURE PHASE AND GAIN IMBALANCE

BACKGROUND OF THE INVENTION

1. Field of the Invention

The present invention relates to radar signal processing. More specifically, the present invention relates to the calibration and correction of phase and gain imbalances between the in-phase (I) and quadrature (Q) outputs of a radar receiver channel.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Coherent radars measure target velocity along the line-of-sight by determining the Doppler frequency shift of the received radar return. Typically, an I/Q synchronous detector is used to form I and Q components of the received signal. These components are then digitized and processed by a digital FFT (Fast Fourier Transform) to form narrowband Doppler filters. If a single frequency signal is input into an ideal receiver with no phase or gain errors, the signal will appear in one filter of the Doppler filter output. If the I and Q channels do not have exactly the same gain or if the phase shift between the two channels is not exactly 90 degrees, a spurious signal, usually referred to as the "image", will be generated at the output of the Doppler signal processor. The magnitude of the spurious signal is directly proportional to the gain and phase errors between the two channels. The frequency of the spurious signal is equal to the frequency of the true signal, but with the opposite phase rotation.

In a digital Doppler filter bank of N filters, numbered 0 through N-1, with a signal in filter k, the image signal will appear in filter N-k-1. This spurious signal may be classified in error as a real target or may obscure real target returns. There is therefore a need in the art for a technique for reducing the magnitude of the spurious signal.

One technique for controlling the phase and gain imbalance involves the building of the radar receiver hardware in accordance with very tight specifications. For example, those skilled in the art will appreciated that to ensure that the image is 25 dB below the return signal, the gain and phase errors must be held to about 0.5 dB and 5 degrees, respectively. In applications where these tolerances must be maintained over a wide temperature range and/or where extensive measurement and trimming of circuit component values is not cost effective, additional design complexity must be added to the receiver design to ensure that the tolerances are met. The smaller the requirement for the image, the more receiver design complexity is required.

Thus, there is a need in the art for a simple technique that would allow the phase and gain imbalance to be measured and the error removed in real time. This would allow the image requirement to be met using a simplified and less expensive analog receiver design built to looser tolerances.

SUMMARY OF THE INVENTION

The present invention is a system and method for correcting gain and phase imbalance errors between I and Q channels of a synchronous detector. In a most general sense, the system includes a first circuit for detecting and measuring an imbalance error, a method for computing numerical coefficients to correct the error, and a second circuit for applying the correction factors to received signal data to eliminate the effects of the imbalance error. More specifically, the invention provides a method for correcting phase and gain imbalance errors in a synchronous detector which includes the steps of:

a) inputting a signal into the detector and extracting therefrom a received signal and a corresponding image signal;

b) inputting the received signal in a first Doppler filter;

c) inputting the image signal in a second Doppler filter;

d) forming a first discriminant $g = \text{Re}\{V_T \times V_I / |V_T|^2\}$;

e) forming a second discriminant $h = \text{Im}\{V_T \times V_I / |V_T|^2\}$; where:

$V_T$ = the complex (real and imaginary parts) voltage output of a target at the output of the first filter and $V_I$ = the complex (real and imaginary parts) voltage output of an image of the target at the output of the second filter;

f) computing phase ($\phi$) and gain ($\rho$) errors from the first and second discriminants;

g) calculating first and second correction factors (m and n) based on the phase and gain errors; and h) using the correction factors to correct the phase and gain imbalance errors.

DESCRIPTION OF THE INVENTION

Illustrative embodiments and exemplary applications will now be described with reference to the accompanying drawings to disclose the advantageous teachings of the present invention.

Figure 1:
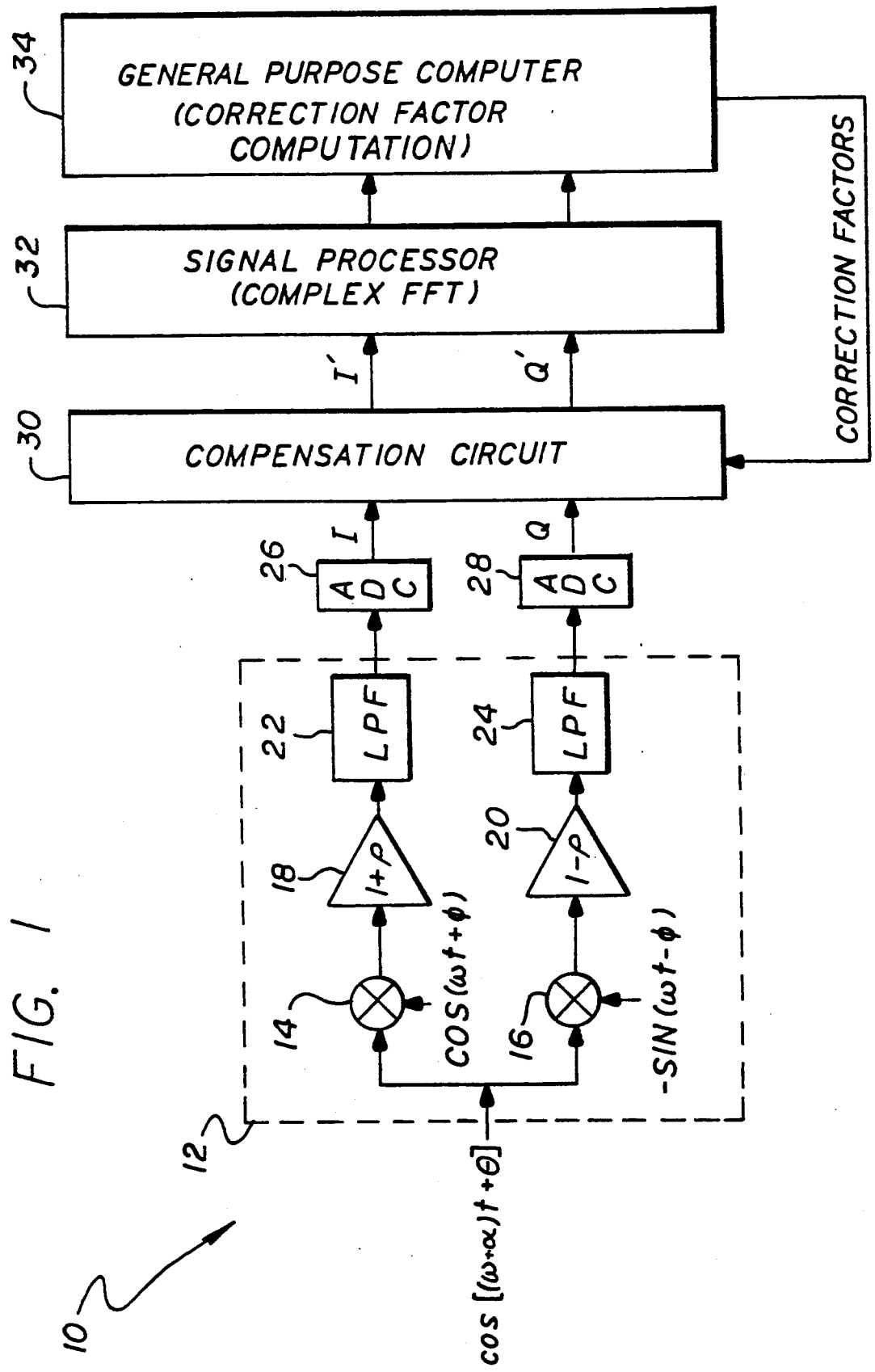
FIG. 1 illustrates the receiver of the present invention.

FIG. 1 illustrates the receiver 10 of the present invention including a synchronous detector 12 with a gain imbalance of $+\rho$ and $-\rho$ and a phase imbalance of $+\phi$ and $-\phi$ in the I and Q channels respectively. The received signal is of the form $\cos[(\omega+\alpha)t+\Theta]$ where $\omega$ represents the IF (intermediate frequency) and the LO (local oscillator) frequency, $\alpha$ represents the Doppler frequency, and $\Theta$ represents the initial phase of the IF input signal. Quadrature mixers 14 and 16 serve to create the in-phase and quadrature signal components of the received signal by mixing the received signal with cosine and minus sine functions of the local oscillator frequency $\omega$. A phase imbalance is represented by the $\phi$ terms in the cosine and sine terms input into the quadrature mixers 14 and 16. Amplifiers 18 and 20 serve to amplify the quadrature signals. A gain imbalance is represented by the $\rho$ gain terms shown in the amplifiers 18 and 20. The synchronous detector 12 is completed with I and Q channel low pass filters 22 and 24.

In accordance with conventional teachings, the outputs of the synchronous detector 12 are digitized by analog-to-digital converters 26 and 28 and input to a digital signal processor 32. The signal processor performs complex Fast Fourier Transforms to convert the time domain digital signal into frequency domain data.

In accordance with the present teachings, the complex outputs of the FFT are sent to a general purpose computer (34) and are used to generate two correction factors. In the illustrative embodiment, the two correction factors are used in a compensation circuit 30 to correct the digitized output of the receiver to remove the errors induced by the I/Q phase and gain imbalance.

Figure 2:
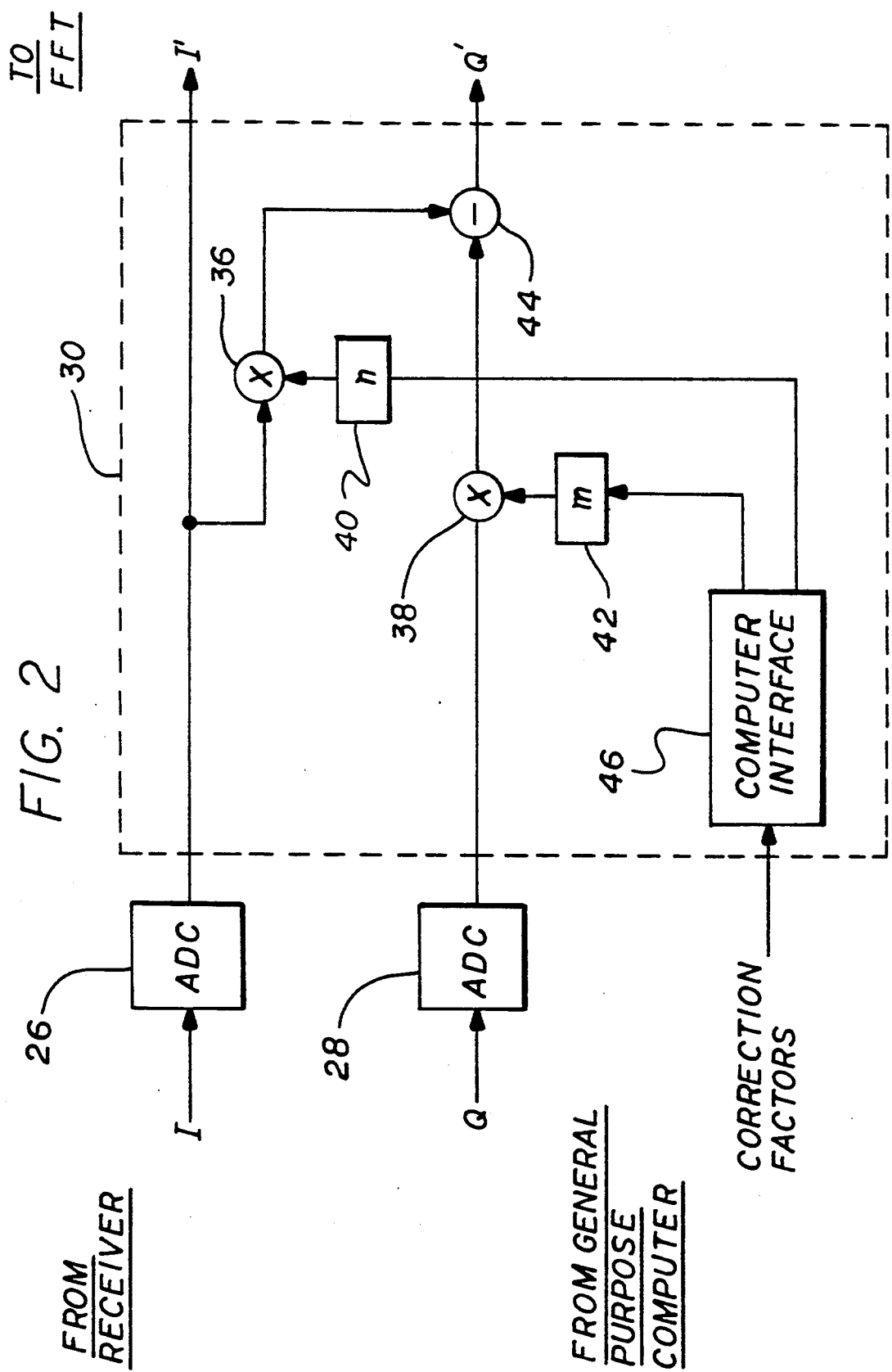
FIG. 2 shows an illustrative implementation of the compensation circuit of the present invention.

FIG. 2 shows an illustrative implementation of the compensation circuit 30 of the present invention. The compensation circuit 30 includes two digital multipliers 36 and 38 two data latches 40 and 42 and a subtractor 44. The data latches 40 and 42 are loaded with the correction factor coefficients received over a data bus and input into the compensation circuit 30 from the general purpose computer 34 through a computer interface 46. Hence, the digitized I and Q signals received from the analog-to-digital converters 26 and 28 are multiplied by the m and n correction factors and subtracted from each other to provide the compensated quadrature output Q'.

Returning to FIG. 1, with no compensation applied (i.e., m=1 and n=0) a signal is inserted into the receiver that places the receive signal and the image signals in separate Doppler filters. Two discriminants are then formed:

$$g = Re\{V_T x V_I / |V_T|^2\}$$

and $$h = Im\{V_T x V_I / |V_T|^2\}$$

where:
$V_T$ = the complex output of the target at the FFT output and
$V_I$ = the complex output of the image at the FFT output.

From g and h, the phase ($\phi$) and gain ($\rho$) errors can be computed. Knowing $\phi$ and $\rho$, two correction factors, m and n, can be determined. Finally, the value of Q is corrected using the formula:

$$Q' = mQ - nI$$

where Q' is the corrected quadrature signal. The in-phase (I) signal input into the compensation circuit is unchanged and is passed directly to the output as I'.

The equations to perform the correction represent a closed form solution and will effectively eliminate the spurious image.

In operation, the I and Q outputs generated by the synchronous detector 12 with gain and phase errors are:

$$I = (1+\rho) \cos[(\omega+\alpha)t+\Theta] \cos(\omega t + \phi) \quad [1]$$

$$= (1+\rho)\{\cos[(2\omega+\alpha)t+\Theta+\phi] + \cos[\alpha t+\Theta-\phi]\}/2 \quad [2]$$

$$Q = -(1-\rho) \cos[(\omega+\alpha)t+\Theta] \sin(\omega t - \phi) \text{ tm} \quad [3]$$

$$= -(1-\rho)\{\sin[(2\omega+\alpha)t+\Theta-\phi] - \sin[\alpha t+\Theta+\phi]\}/2 \quad [4]$$

The $2\omega$ terms are filtered out by the low pass filters 22 and 24 leaving:

$$I = (1+\rho) \cos[\alpha t+\Theta-\phi]/2 \quad [5]$$

$$Q = (1-\rho) \sin[\alpha t+\Theta+\phi]/2 \quad [6]$$

Let the I channel be viewed as a reference, and passed directly through the compensation circuit 30. Then:

$$I' = (1+\rho) \cos[\alpha t+\Theta-\phi]/2$$

If:

$$Q' = (1+\rho) \sin[\alpha t+\Theta-\phi]/2 \quad [7]$$

then, the amplitudes of I' and Q' would be identical, viz., equal gain of $(1+\rho)$ and the phase difference would be restored to 90 degrees (quadrature phase of $\cos[\alpha t+\Theta-\phi]$ and $\sin[\alpha t+\Theta-\phi]$). With the proper gain and phase relationships restored, the unwanted spurious image signal would be eliminated.

Deriving Q' from I and Q:

From equation [6], regrouping Q, multiplying each side by $(1+\rho)/(1-\rho)$ and expanding:

$$[(1+\rho)/(1-\rho)]Q = [(1+\rho)(1-\rho) \sin[(\alpha t+\Theta-\phi)+(2\phi)]]/[2(1-\rho)] \quad [8]$$

$$= (1+\rho)[\sin(\alpha t+\Theta-\phi) \cos 2\phi + \cos(\alpha t+\Theta-\phi) \sin 2\phi]/2 \quad [9]$$

$$= [(1+\rho) \sin(\alpha t+\Theta-\phi)] \cos 2\phi/2 + [(1+\rho) \cos(\alpha t+\Theta-\phi)] \sin 2\phi/2 \quad [10]$$

However, $$[(1+\rho)[\sin(\alpha t+\Theta-\phi)/2] = Q'$$

in accordance with equation [7] and $$[(1+\rho)[\cos(\alpha t+\Theta-\phi)/2] = I$$

in accordance with equation [5], so:

$$[(1+\rho)/(1-\rho)]Q = Q' \cos(2\phi) + I \sin(2\phi) \quad [11]$$

$$Q' = (1+\rho)Q/[(1-\rho) \cos(2\phi)] - \tan(2\phi)I$$

or $$Q' = mQ - nI \quad [13]$$

where:

$$m = (1+\rho)/[(1-\rho) \cos(2\phi)] \quad [14]$$

and $$n = \tan(2\phi) \quad [15]$$

This illustrates that if it is possible to process the uncorrected I and Q signals to determine the gain and phase errors, $\rho$ and $\phi$, the two correction factors, m and n, can be computed and applied to I and Q to form Q', a Q channel output rescaled and adjusted in phase so that the gains of the two channels are equal $(1+\rho)$ and the phases of the two channels are separated by 90 degrees ($\cos[\alpha t+\Theta-\phi]$ and $\sin[\alpha t+\Theta-\phi]$).

Derivation of Correction Factors:

In brief, by processing the I and Q signals through a complex FFT, the target and image signals may be separated into separate Doppler filters. A discriminant D is formed by manipulating the outputs of the two Doppler filters as follows:

$$D = V_T \times V_I / |V_T|^2 = (I_T + jQ_T) \times (I_I + jQ_I) / |I_T + jQ_T|^2 \quad [16]$$

where:
- $V_T$ = the complex output of the Doppler filter containing the target;
- $V_I$ = the complex output of the Doppler filter containing the image;
- $I_T$ = the real component of $V_T$;
- $Q_T$ = the imaginary component of $V_T$;
- $I_I$ = the real component of $V_I$; and
- $Q_I$ = the imaginary component of $V_I$.

Hence, $$D = (I_T I_I - Q_T Q_I) + j(I_T Q_I + Q_T I_I) / (I_T^2 + Q_T^2) = g + jh \quad [17]$$

where:

$$g = Re\{D\} = \frac{I_T I_I - Q_T Q_I}{I_T^2 + Q_T^2} \quad [18]$$

and $$h = Im\{D\} = \frac{I_T Q_I + Q_T I_I}{I_T^2 + Q_T^2} \quad [19]$$

It will be shown below that:

$$\rho = \{[(1+g^2+h^2)] - [(1+g^2+h^2)^2 - 4g^2]^{\frac{1}{2}}\}/2g \quad [20]$$

and $$\phi = \sin^{-1}[(g-\rho)/g(1-\rho^2)] \quad [21]$$

Knowing the phase and gain errors, the correction factors, m and n, can be found by substituting [20] and [21] into [14] and [15]. Then, the value of Q' can be computed from [13].

So by properly manipulating the outputs of the Doppler filters containing the target and image signals, correction factors may be computed which allow the target to be removed.

Evaluation of $\rho$ and $\phi$:

Expanding equations [5] and [6] as sums of functions of $(\alpha t + \Theta)$ and $\phi$:

$$I = [(1+\rho)/2]\cos(\alpha t + \Theta - \phi) \quad [5]$$
$$= [(1+\rho)/2][\cos(\alpha t + \Theta)\cos(-\phi) - \sin(\alpha t + \Theta)\sin(-\phi)]$$
$$= [(1+\rho)/2][\cos(\alpha t + \Theta)\cos\phi + \sin(\alpha t + \Theta)\sin\phi] \quad [22]$$

and $$Q = [(1-\rho)/2]\sin(\alpha t + \Theta + \phi) \quad [6]$$
$$= [(1-\rho)/2][\cos(\alpha t + \Theta)\sin\phi + \sin(\alpha t + \Theta)\cos\phi] \quad [23]$$

Therefore:

$$I + jQ = (1/2)[(1+\rho)\cos(\alpha t + \Theta)\cos\phi + (1+\rho)\sin(\alpha t + \Theta)\sin\phi] + (j/2)[(1-\rho)\cos(\alpha t + \Theta)\sin\phi + (1-\rho)\sin(\alpha t + \Theta)\cos\phi] \quad [24]$$

-continued $$= (1/2)[\cos(\alpha t + \Theta)\cos\phi + \rho\cos(\alpha t + \Theta)\cos\phi + \sin(\alpha t + \Theta)\sin\phi + \rho\sin(\alpha t + \Theta)\sin\phi + j\cos(\alpha t + \Theta)\sin\phi - j\rho\cos(\alpha t + \Theta)\sin\phi + j\sin(\alpha t + \Theta)\cos\phi - j\rho\sin(\alpha t + \Theta)\cos\phi] \quad [25]$$

Regrouping the terms with a common factor of $\cos\phi$ or $j\sin\phi$:

$$I + jQ = (1/2)\cos\phi \{[\cos(\alpha t + \Theta) + j\sin(\alpha t + \Theta)] + \rho[\cos(\alpha t + \Theta) - j\sin(\alpha t + \Theta)]\} + (j/2)\sin\phi \{[\cos(\alpha t + \Theta) - j\sin(\alpha t + \Theta)] - \rho[\cos(\alpha t + \Theta) + j\sin(\alpha t + \Theta)]\} \quad [26]$$

And finally factoring out the $[\cos(\alpha t + \Theta) + j\sin(\alpha t + \Theta)]$ and $[\cos(\alpha t + \Theta) - j\sin(\alpha t + \Theta)]$ terms:

$$I + jQ = (1/2)[\cos(\alpha t + \Theta) + j\sin(\alpha t + \Theta)][\cos\phi - j\rho\sin\phi] + (1/2)[\cos(\alpha t + \Theta) - j\sin(\alpha t + \Theta)][\rho\cos\phi + j\sin\phi] \quad [27]$$

Those familiar with the art will recognize the term of the form $A[\cos(\alpha t + \Theta) + j\sin(\alpha t + \Theta)]$ as the complex form of a sinusoidal wave of amplitude A, frequency $\alpha/2\pi$ and initial phase $\Theta$. Similarly, the term of the form $A[\cos(\alpha t + \Theta) - j\sin(\alpha t + \Theta)]$ is the complex form of a sinusoidal wave of amplitude A, frequency $-\alpha/2\pi$ (opposite sense of rotation), and initial phase $-\Theta$. These two frequencies will be extracted by two distinct filters of the FFT 32. The output response of each filter will be proportional to the signal amplitude, A, and the phase will equal the initial phase, $\Theta$.

For the signal $I + jQ$ of equation [27], the FFT 32 extracts the $+\alpha$ and $-\alpha$ frequencies, so the complex FFT outputs are the target voltage, $V_T$:

$$V(\alpha) = V_T = (1/2)e^{j\Theta}\{\cos\phi - j\rho\sin\phi\} \quad [28]$$

and the image voltage, $V_I$:

$$V(-\alpha) = V_I = (1/2)e^{-j\Theta}\{\rho\cos\phi + j\sin\phi\} \quad [29]$$

where the exponential form, $e^{\pm j\Theta}$ is used to express the initial phase, $\cos(\Theta) \pm j\sin(\Theta)$.

Now, using equation [16] to form the discriminant D yields:

$$D = V_T \times V_I / |V_T|^2 \quad [16]$$
$$= (e^{j\Theta}/2)(e^{-j\Theta}/2)\{[\rho\cos^2\phi + \rho\sin^2\phi] + j[\cos\phi\sin\phi - \rho^2\cos\phi\sin\phi]\}/[(1/2)(\cos^2\phi + \rho^2\sin^2\phi)^{\frac{1}{2}}]^2 \quad [30]$$
$$= [\rho + j(1-\rho^2)\cos\phi\sin\phi]/(\cos^2\phi + \rho^2\sin^2\phi) \quad [31]$$

Let:

$$g = Re\{D\} = \rho/(\cos^2\phi + \rho^2\sin^2\phi) \quad [32]$$

and $$h = Im\{D\} = (1-\rho^2)\cos\phi\sin\phi/(\cos^2\phi + \rho^2\sin^2\phi) \quad [33]$$

Note that for small gain and phase errors, $g \approx \rho$ and $h \approx \cos\phi\sin\phi \approx (1/2)\sin(\phi/2)$.

From [32], solving for $\cos^2\phi$ and $\sin^2\phi$ in terms of g and $\rho$:

$$\cos^2\phi + \rho^2 \sin^2\phi = \rho/g \quad [34]$$

$$(1-\sin^2\phi) + \rho^2\sin^2\phi = 1 - (1-\rho^2)\sin^2\phi = \rho/g \quad [35]$$

$$\sin^2\phi = (1-\rho/g)/(1-\rho^2) = (g-\rho)/g(1-\rho^2) \quad [36]$$

and $$\cos^2\phi + \rho^2(1-\cos^2\phi) = \rho^2 + (1-\rho^2)\cos^2\phi = \rho/g \quad [37]$$

$$\cos^2\phi = ((\rho/g) - \rho^2)/(1-\rho^2) = (\rho - g\rho^2)/g(1-\rho^2) \quad [38]$$

Substituting equations [36] and [38] into equation [33], allows us to solve for the gain imbalance, $\rho$, in terms of g and h, which were computed from the FFT outputs. Hence:

$$h = (1-\rho^2)\cos\phi\sin\phi/(\cos^2\phi + \rho^2\sin^2\phi) \quad [39]$$

$$= \frac{(1-\rho^2)\{[(\rho-g\rho^2)/g(1-\rho^2)][(g-\rho)/g(1-\rho^2)]\}^{\frac{1}{2}}}{[(\rho-g\rho^2)/g(1-\rho^2)] + [\rho^2(g-\rho)/g(1-\rho^2)]}$$

$$= \frac{(1-\rho^2)(g\rho - \rho^2 - g^2\rho^2 + g\rho^3)^{\frac{1}{2}}}{\rho - g\rho^2 + g\rho^2 - \rho^3} \quad [40]$$

$$= \frac{[g\rho^3 - (1+g^2)\rho^2 + g\rho]^{\frac{1}{2}}}{\rho} \quad [41]$$

$$\rho^2 h^2 = g\rho^3 - (1+g^2)\rho^2 + g\rho \quad [42]$$

$$g\rho^2 - (1+g^2+h^2)\rho + g = 0 \quad [43]$$

$$\rho = \frac{(1+g^2+h^2) \pm [(1+g^2+h^2)^2 - 4g^2]^{\frac{1}{2}}}{2g} \quad [44]$$

Since from equation [32], $g \approx \rho$, of the two roots for $\rho$, the one of interest is:

$$\rho = \frac{(1+g^2+h^2) - [(1+g^2+h^2)^2 - 4g^2]^{\frac{1}{2}}}{2g} \quad [45]$$

Rearranging equation [36] allows us to solve for the phase imbalance, $\phi$, in terms of the measured value, g, and the computed value, $\rho$, from equation [45]. Hence:

$$\phi = \sin^{-1}[(g-\rho)/g(1-\rho^2)]^{1/2} \quad [46]$$

This derivation shows that the phase and gain errors, $\phi$ and $\rho$, can be computed from the discriminants g and h which were computed from the output of the FFT filters 32 containing the target and image signals.

Computation of the Correction Factors m and n:
As shown in equations [14] and [15] above:

$$m = (1+\rho)/[(1-\rho)\cos(2\phi)] \quad [47]$$

and $$n = \tan(2\phi) \quad [48]$$

Thus, the correction factors m and n are computed by the general purpose computer 34 and fed back to the compensation circuit 30. The compensation circuit 30 adjusts one of the quadrature signals in accordance with equation [13]:

$$Q' = mQ - nI \quad [49]$$

If there is only a gain error, then $$m = (1+\rho)/[(1-\rho)\cos(2\phi)] = (1+\rho)/(1-\rho) \quad [49A]$$

$$n = \tan(2\phi) = 0 \quad [49B]$$

For this special case (or if the effect of phase error is ignored), compensation can be accomplished using only one multiply since the coefficient n equals zero.

Calibration:

A target signal is placed in a Doppler filter such that the target filter and image filter are separated. The real and imaginary outputs of the FFT are output to the general purpose computer and equations [32] and [33] are implemented as follows:

$$g = \frac{Re\{Target\} \times Re\{Image\} - Im\{Target\} \times Im\{Image\}}{Re\{Target\}^2 + Im\{Target\}^2} \quad [50]$$

and $$h = \frac{Re\{Target\} \times Im\{Image\} + Im\{Target\} \times Re\{Image\}}{Re\{Target\}^2 + Im\{Target\}^2} \quad [51]$$

The receiver 10 is adapted for use in a radar system such as that of a missile (not shown).

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A method for correcting phase and gain imbalance errors in synchronous detector including the steps of:
   a) inputting a signal into said detector and extracting therefrom a received signal and a corresponding image signal;
   b) inputting said received signal in a first Doppler filter;
   c) inputting said image signal in a second Doppler filter;
   d) forming a first discriminant $g = Re\{V_T \bar{x} V_I / |V_T|^2\}$;
   e) forming a second discriminant $h = Im\{V_T \bar{x} V_I / |V_T|^2\}$; where:
      $V_T$ = the complex voltage output of a target at the output of the first filter and
      $V_I$ = the complex voltage output of an image of the target at the output of the second filter;
   computing phase ($\phi$) and gain ($\rho$) errors from the first and second discriminants according to the relationships:

$$\rho = \frac{(1+g^2+h^2) - [(1+g^2+h^2)^2 - 4g^2]^{\frac{1}{2}}}{2g}$$

and $$\phi = \sin^{-1}[(g-\rho)/g(1-\rho^2)]^{\frac{1}{2}};$$

g) calculating first and second correction factors based on said phase and gain errors according to the relationships $$m = (1+\rho)/[(1-\rho)\cos(2\phi)]$$

and $n = \tan(2\phi)$; and h) using the correction factors to correct the phase and gain imbalance errors.

2. The invention of claim 1 wherein the step h) includes the step of forming I' and Q' according to the relationships:

$I' = I$ $Q' = mQ - nI$ where Q' is the corrected quadrature signal and I' is set to equal the received in-phase signal I.

* * * * *